United States Patent
Imtiaz (10) Patent No.: US 7,321,484 B2
(45) Date of Patent: Jan. 22, 2008

(54) PROVIDING ACCURATE DETECTION OF CHIP OVERHEAT AND LOCAL OVERHEAT CONDITIONS IN INTEGRATED CIRCUITS

(75) Inventor: S. M. Sohel Imtiaz, San Jose, CA (US)

(73) Assignee: Micrel, Incorporated, San Jose, CA (US)

(*) Notice: Subject to any disclaimer, the term of this patent is extended or adjusted under 35 U.S.C. 154(b) by 202 days.

(21) Appl. No.: 11/165,712

(22) Filed: Jun. 24, 2005

(65) Prior Publication Data
US 2006/0291123 A1    Dec. 28, 2006

(51) Int. Cl.
H02H 5/04    (2006.01)
(52) U.S. Cl. .................................... 361/103
(58) Field of Classification Search ............. 361/103, 361/106
See application file for complete search history.

(56) References Cited

U.S. PATENT DOCUMENTS

| | | | | |
|---|---|---|---|---|
| 5,675,297 A | * | 10/1997 | Gose et al. | 332/109 |
| 6,061,221 A | * | 5/2000 | Tihanyi | 361/103 |
| 6,351,360 B1 | * | 2/2002 | Kotowski et al. | 361/103 |
| 6,624,995 B2 | * | 9/2003 | Barrow et al. | 361/103 |
| 7,123,995 B1 | * | 10/2006 | Desai et al. | 700/299 |

OTHER PUBLICATIONS

Data Sheet entitled: "2 A, High-Side P-Channel Switch With Current Limit And Thermal Shutdown", 2003 Analog Devices, Inc., pp. 1-8.
Data Sheet entitled: "Programmable Current Limit High-Side Switch", MIC2544/2548, 2004 Micrel, Incorporated, pp. 1-12.

* cited by examiner

Primary Examiner—Michael Sherry
Assistant Examiner—Christopher J Clark
(74) Attorney, Agent, or Firm—Bever, Hoffman & Harms, LLP; Jeanette S. Harms (57) ABSTRACT

A thermal shutdown system that can accurately detect a chip overheat condition or a local overheat condition is described. This system can include a first shutdown circuit triggered by the chip overheat condition and a second shutdown circuit triggered by the local overheat condition. The second shutdown circuit can be located near the heat-generating component on the IC. The first shutdown circuit can be located in another area of the IC. A common temperature independent signal, which indicates whether a local overheat condition is anticipated, can enable one shutdown circuit and disable the other shutdown circuit. An enabled shutdown circuit can respond to a temperature sensitive signal to indicate a fault condition, i.e. Ea chip/local overheat condition.

19 Claims, 5 Drawing Sheets

PROVIDING ACCURATE DETECTION OF CHIP OVERHEAT AND LOCAL OVERHEAT CONDITIONS IN INTEGRATED CIRCUITS

BACKGROUND OF THE INVENTION

1. Field of the Invention

The present invention relates to temperature sensitive chips and in particular to a technique to isolate thermal shutdown from current limit shutdown.

2. Related Art

A current limit circuit is typically provided in an integrated circuit (IC) to protect a power device in the IC as well as the external load the IC is driving from excessive current. Typically, a standard current limit circuit monitors the current through a portion (1-2%) of the power device to determine if excessive current is present (e.g. 150 mA to 1.5 A). Note that a power device, e.g. Ea power device forming part of a voltage regulator, is schematically shown as a single transistor. However, the power device is actually implemented using thousands or even tens of thousands of transistors.

As a result, a short circuit in the power device, which is relatively common (because the output of the power device is provided to a pin of the IC, which can be easily, but erroneously, connected to ground instead of a load), can generate a high local temperature. Unfortunately, although a current limit circuit can detect a short circuit, sometimes the local temperature rises so quickly that it can damage circuitry before the current limit circuit can react. Thus, a voltage regulator (or even other circuitry if the IC is small and unable to efficiently dissipate the heat) can be easily damaged due to overheating during a short circuit.

Figure 1:
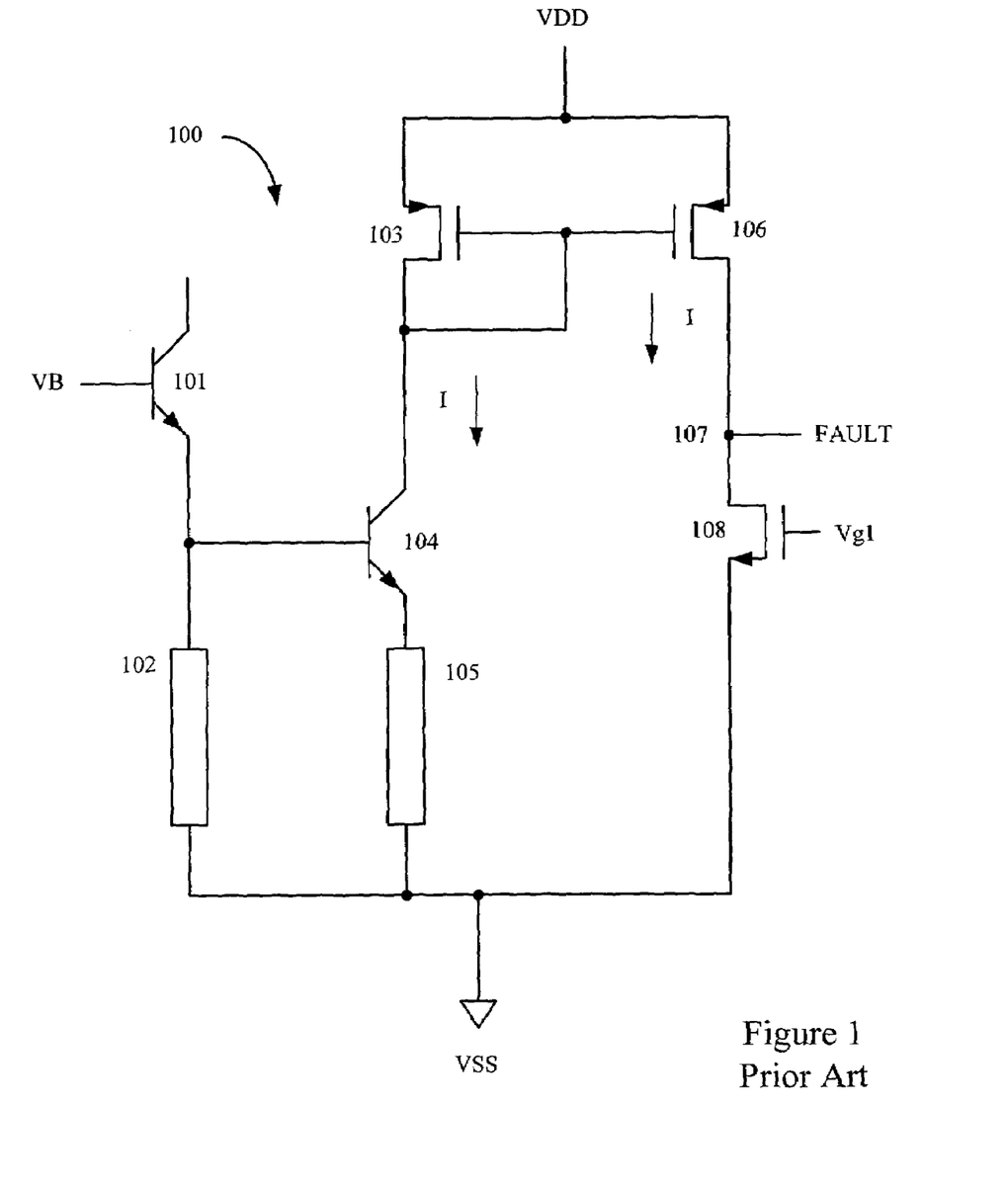
FIG. 1 illustrates a prior art thermal shutdown circuit.

To solve this problem, a thermal shutdown circuit can be positioned near the voltage regulator. FIG. 1 illustrates a standard thermal shutdown circuit 100 including NPN transistors 101 and 104, PMOS transistors 103 and 106, an NMOS transistor 108, and resistors 102 and 105. In this embodiment, resistor 102 can be connected between an emitter of NPN transistor 101 and voltage source VSS (e.g. ground). Similarly, resistor 105 can be connected between an emitter of NPN transistor 104 and VSS. The base of NPN transistor 104 can be connected to the emitter of NPN transistor 101. Note that the collector of NPN transistor 101 can be connected to other circuitry providing a high voltage (not shown for simplicity).

The sources of PMOS transistors 103 and 106 can be connected to a voltage source VDD. The gates of PMOS transistors 103 and 106 can be commonly connected to the drain of PMOS transistor 103 and the collector of NPN transistor 104. The drain of PMOS transistor 106 can be connected to the drain of NMOS transistor 108, wherein the source of NMOS transistor 108 can be connected to VSS.

In thermal shutdown circuit 100, a voltage VB can be applied at the base of NPN transistor 101. The voltage VB is equal to the difference between a bandgap voltage VBG, which can be generated by a bandgap voltage circuit, and a base to emitter voltage VBE (i.e. VB=VBG−VBE). NMOS transistor 108 receives a gate bias voltage Vg1, which moderately turns on NMOS transistor 108. A node 107 provides the FAULT signal of thermal shutdown circuit 100.

In thermal shutdown circuit 100, at a predetermined temperature defining a thermal shutdown (e.g. over 140° C.), voltage VBE is decreased enough to turn on NPN transistor 101. With NPN transistor 101 conducting, a high voltage is also provided to the base of NPN transistor 104, thereby turning on that transistor as well.

When conducting, NPN transistor 104 pulls down the voltage at the drain of PMOS transistor, and thus also pulls down the voltage at the gates of PMOS transistors 103 and 106. This low voltage turns on PMOS transistors 103 and 106, thereby allowing a current I to flow through PMOS transistors 103 and 106, which form a current mirror.

Therefore, during a thermal shutdown in which PMOS transistor 106 is conducting (if only briefly), thereby overcoming the relatively weak pull down provided by NMOS transistor 108, node 107 receives a high voltage, thereby generating a high FAULT signal. This high FAULT signal triggers an IC shutdown. As a result, the IC can quickly shut down if a short circuit occurs.

Unfortunately, if thermal shutdown circuit 200 is proximate to the voltage regulator (and thus the power device), then the thermal shutdown circuit can improperly function during normal operation. Specifically, the VBE of NPN transistors 101 and 104 at room temperature is approximately 0.7 V. However, as the local temperature increases, which is typical in a power device during normal operation, the VBE voltage decreases. For example, at a temperature of approximately 135° C., which is less than the defined thermal shutdown trigger at 140° C., the VBE may decrease to 0.4 V, thereby allowing NPN transistors 101 and 104 to turn on even though a thermal shutdown should not be triggered.

Therefore, a need arises for an efficient thermal shutdown system, which can accurately detect both a local overheat condition as well as a chip overheat condition.

SUMMARY OF THE INVENTION

A thermal shutdown system for an integrated circuit (IC) can advantageously include two shutdown circuits. A first shutdown circuit can be triggered by a chip overheat condition whereas a second shutdown circuit can be triggered by a local overheat condition. A temperature independent feedback signal provided to the second shutdown circuit can be used to anticipate the local overheat condition, i.e. to enable the second shutdown circuit in anticipation of a local overheat condition. This feedback signal can also disable the second shutdown circuit during normal operation.

In one embodiment, the IC is a voltage regulator chip and the power device of the voltage regulator is the source generating the local overheat condition during a short circuit. Each of the first and second shutdown circuits can include an element that responds to temperature increases. For example, in one embodiment, this element can be a bipolar transistor, wherein the base to emitter voltage VBE decreases when the temperature increases. At least this element of the second shutdown circuit can be placed proximate to the heat source, thereby allowing a local overheat condition to be quickly detected.

In the voltage regulator embodiment, the feedback signal can be an output voltage Vout of the integrated circuit. Specifically, during a short circuit, the output pin providing Vout is grounded. Thus, a local overheat condition caused by the short circuit can be anticipated by noting that Vout=0. In one embodiment, Vout can be used to enable the first shutdown circuit (and disable the second shutdown circuit) during normal operation and to enable the second shutdown circuit (and disable the first shutdown circuit) during a short circuit.

In one embodiment, the first and second shutdown circuits can provide their outputs to control circuitry for processing. This control circuitry can include at least one logic gate for determining if either a local overheat condition or a chip overheat condition is occurring. If either condition is occurring, then the control circuitry can output a predetermined fault signal.

In one exemplary implementation, the thermal shutdown system can include six MOS transistors and four bipolar transistors. A first MOS transistor can have a source connected to a first voltage source, a gate for receiving a triggering signal, and a drain. A second MOS transistor can have a source connected to the first voltage source, and a gate and a drain connected to the drain of the first transistor. A third MOS transistor can have a source connected to the first voltage source, a gate connected to the gate of the second MOS transistor, and a drain connected to a first voltage associated with a second voltage source. A fourth MOS transistor can have a source connected to the first voltage source, a gate for receiving an inverted triggering signal, and a drain. A fifth MOS transistor can have a source connected to the first voltage source, and a gate and a drain connected to the drain of the fourth MOS transistor. A sixth MOS transistor can have a source connected to the first voltage source, a gate connected to the gate of the fifth MOS transistor, and a drain connected to the first voltage.

A first bipolar transistor can have a base connected to a bias voltage, a collector connected to a second voltage associated with the first voltage source, and an emitter connected to a third voltage associated with the second voltage source. A second bipolar transistor can have a base connected the emitter of the first bipolar transistor, a collector connected to the drain of the second MOS transistor, and an emitter coupled to a second voltage source. A third bipolar transistor can have a base connected to the bias voltage, a collector connected to the second voltage, and an emitter connected to the third voltage. A fourth bipolar transistor can have a base connected the emitter of the third bipolar transistor, a collector connected to the drain of the fifth MOS transistor, and an emitter coupled to a second voltage source. In this embodiment, the thermal shutdown system can further include a control circuit having a first input connected to the drain of the third MOS transistor and a second input connected to the drain of the sixth MOS transistor, wherein the control circuit outputs a fault signal.

A method of detecting a fault condition on an integrated circuit is also described. This fault condition can be caused by a chip overheat condition or a local overheat condition. In this method, at least a portion of a first shutdown circuit can be located proximate to a source of the local overheat condition. A second shutdown circuit can be located in another part of the integrated circuit (i.e. Ea location not proximate to the source of the local overheat condition). An enabling signal can be used to enable/disable at least the first shutdown circuit. Advantageously, this enabling signal can be temperature independent.

Another thermal shutdown system for an integrated circuit (IC) is also described. This thermal shutdown system can include first and second thermal shutdown circuits. Each thermal shutdown circuit receives a common temperature independent signal that enables one of the thermal shutdown circuits and disables the other thermal shutdown circuit. Each thermal shutdown circuit also receives a temperature dependent signal that can activate an enabled thermal shutdown circuit to indicate a fault condition. The fault condition can be a chip overheat condition or a local overheat condition.

DETAILED DESCRIPTION OF THE FIGURES

A standard thermal shutdown circuit can be placed near an integrated circuit component that generates heat, thereby allowing the standard thermal shutdown circuit to detect a local overheat condition. However, such a standard thermal shutdown circuit can erroneously generate a chip shutdown during a high temperature condition that is less than a defined thermal shutdown temperature.

In accordance with one aspect of the invention, two shutdown circuits can be provided on the integrated circuit. A local overheat condition can activate one shutdown circuit, whereas a chip overheat condition can activate the other shutdown circuit. Notably, the shutdown circuit activated by the local overheat condition can receive a feedback signal that anticipates a local overheat condition, e.g. Ea short circuit. Advantageously, this feedback signal, which is temperature-independent, can ensure that a high temperature, but less than a defined overheat condition, will not trigger a chip shutdown.

Figure 2:
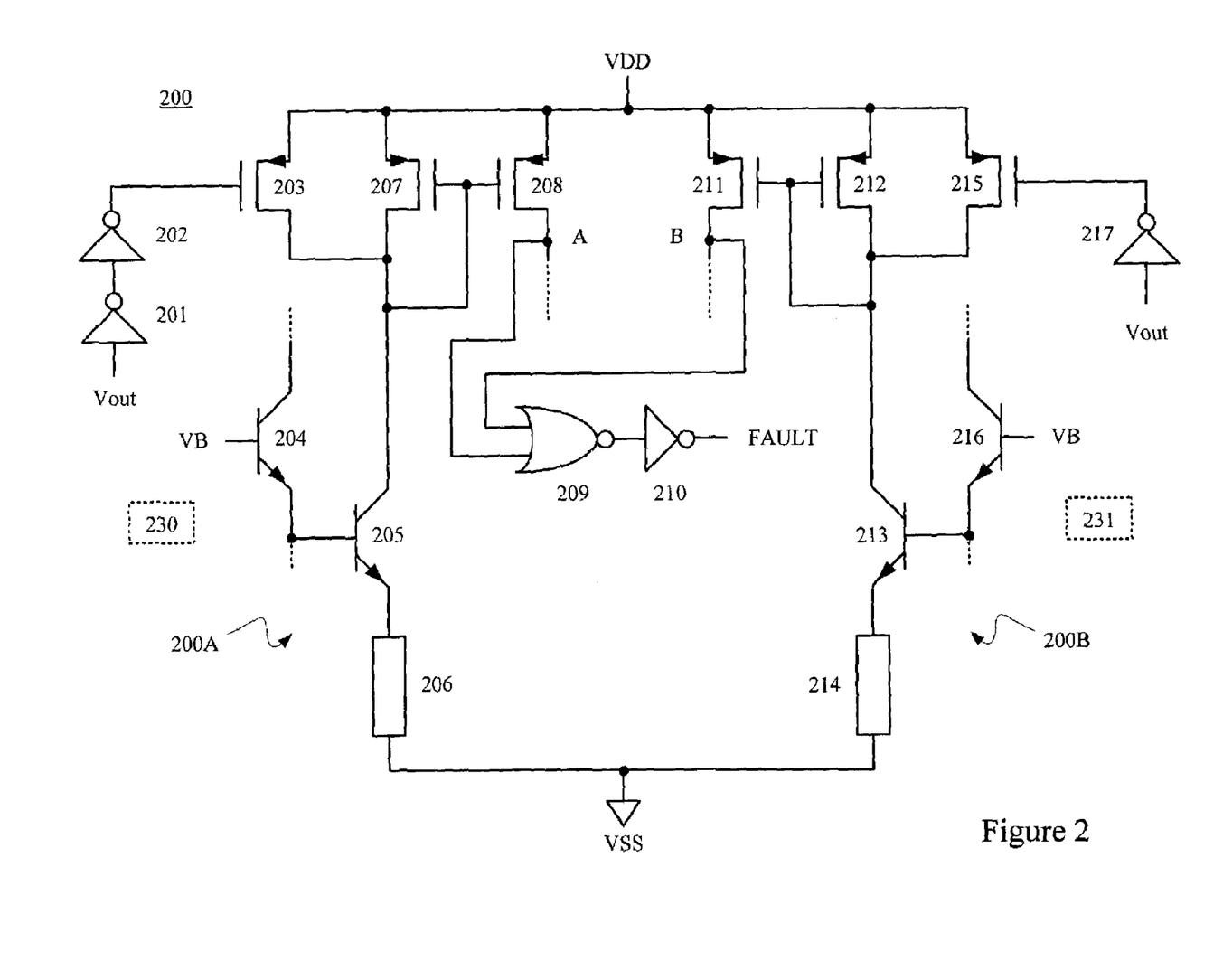
FIG. 2 illustrates an exemplary thermal shutdown system in which a first shutdown circuit can be activated during a local overheat condition and a second shutdown circuit can be activated during a chip overheat condition.

FIG. 2 illustrates an exemplary shutdown system 200 including two separate shutdown circuits 200A and 200B. In system 200, shutdown circuit 200A can be placed in or near a bandgap block 230 whereas shutdown circuit 200B can be placed in relative proximity to a power device 231. A bandgap block can advantageously generate a temperature independent voltage VBG in the range of 1.2-1.3 V, which is close to the theoretical bandgap of silicon at 0 K. In accordance with one aspect of the invention, shutdown circuit 200A can be activated during a chip overheat condition whereas shutdown circuit 200B can be activated during a local overheat condition.

Shutdown System: Exemplary Configuration

Shutdown circuit 200A can include inverters 201 and 202, PMOS transistors 203, 207, and 208, NPN transistors 204 and 205, and a resistor 206. In this embodiment, PMOS transistors 203 and 207 have their sources commonly connected to voltage source VDD and their drains commonly connected to the gates of PMOS transistors 207 and 208. The source of PMOS transistor 208 is also connected to voltage source VDD. The gate of PMOS transistor 203 receives an output of serially connected inverters 201 and 202, which buffer a voltage Vout.

NPN transistor 204 receives voltage VB on its base and has its emitter connected to the base of NPN transistor 205. The collector of NPN transistor 204 can provide a strong pull up whereas the emitter of NPN transistor 204 can provide a weak pull down (strong pull up and weak pull down circuitry not shown for simplicity). The collector of NPN transistor 205 can be connected to the drain of PMOS transistor 207. Resistor 206 can be connected between the emitter of NPN transistor 205 and a voltage source VSS.

Shutdown circuit 200B can include inverter 217, PMOS transistors 211, 212, and 215, NPN transistors 213 and 216, and a resistor 214. In this embodiment, PMOS transistors 212 and 215 have their sources commonly connected to voltage source VDD and their drains commonly connected to the gates of PMOS transistors 211 and 212. The source of PMOS transistor 211 is also connected to voltage source VDD. The gate of PMOS transistor 215 receives an output of inverter 217, which inverts voltage Vout.

NPN transistor 216 receives voltage VB on its base and has its emitter connected to the base of NPN transistor 213. The collector of NPN transistor 216 can provide a strong pull up whereas the emitter of NPN transistor 216 can provide a weak pull down (strong pull up and weak pull down circuitry not shown for simplicity). The collector of NPN transistor 213 can be connected to the drain of PMOS transistor 212. Resistor 214 can be connected between the emitter of NPN transistor 213 and voltage source VSS. Notably, nodes A and B, which are connected to the drains of PMOS transistors 208 and 211, can provide a weak pull down (weak pull down circuitry not shown for simplicity). In one embodiment, the pull down circuitry connected to the emitters of NPN transistors 204 and 216 as well as to nodes A and B can include NMOS transistors connected to voltage VSS (see, for example, NMOS transistor 108 in FIG. 1), wherein each NMOS transistor can receive a relatively high bias voltage (e.g. VG1) on its gate to moderately turn on that transistor.

Short Circuit Condition: Vout=0

In accordance with one aspect of the invention, a temperature-independent feedback signal can be used to anticipate a local overheat condition. Specifically, in this embodiment, a voltage Vout can be used. Voltage Vout, which is an output voltage of the integrated circuit (and generated by power device 231), is typically connected to an off-chip load. Notably, when the output pin providing voltage Vout is erroneously connected to ground instead of the load, a short circuit occurs, thereby resulting in Vout being zero. Thus voltage Vout can be characterized as a temperature independent signal.

In shutdown circuit 200A, when voltage Vout is zero, inverters 201 and 202 buffer Vout, thereby providing a logic zero signal to the gate of PMOS transistor 203. In this case, PMOS transistor 203 will turn on, thereby transferring a voltage close to VDD to the gates of PMOS transistors 207 and 208. Consequently, PMOS transistors 207 and 208 are turned off, i.e. disabled. When PMOS transistor 208 is turned off, node A will be low because of the weak pull down, thereby providing a logic zero signal to a NOR gate 209.

In shutdown circuit 200B, when Vout is zero, inverter 217 inverts that signal, thereby providing a logic one signal to the gate of PMOS transistor 215. In this case, PMOS transistor 215 is turned off. Notably, during a local overheat condition (which occurs during a short circuit), the voltage VBE of NPN transistor 216 near power device 231 (but not that of NPN transistors 204 and 205 near bandgap block 230) will be reduced due to localized overheating. Reducing the voltage VBE can turn on NPN transistor 216. NPN transistor 216, when conducting, provides a high voltage to the base of NPN transistor 213, thereby turning on that transistor as well. NPN transistor 213, when conducting, provides a low voltage (via resistor 214) to the gates of PMOS transistors 211 and 212. Consequently, PMOS transistors 211 and 212 are turned on, i.e. enabled. When PMOS transistor 211 is turned on, node B will be high because the transferred high signal will overcome the weak pull down, thereby providing a logic one signal to NOR gate 209.

Thus, in a local overheat condition, NOR gate 209 receives a logic zero signal from node A (the output of shutdown circuit 200A) and a logic one signal from node B (the output of shutdown circuit 200B). With these inputs, NOR gate 209 outputs a logic zero signal, which is then inverted by inverter 210. Therefore, the FAULT signal will be a logic one signal, which indicates a fault condition.

Normal Operation with Chip Overheating: Vout=1

In shutdown circuit 200B, when voltage Vout is high (which indicates normal operation), PMOS transistor 215 will receive a logic zero signal from inverter 217, thereby turning on and transferring a voltage close to VDD to the gates of PMOS transistors 211 and 212. Consequently, PMOS transistors 211 and 212 are turned off, i.e. disabled. Notably, even if an overall chip temperature increase turns on NPN transistors 216 and 213, the high voltage transferred by conducting PMOS transistor 215 would overcome the low voltage transferred by conducting NPN transistor 213. Because PMOS transistor 211 remains turned off, node B will be low because of the weak pull down, thereby providing a logic zero signal to NOR gate 209.

In shutdown circuit 200A, with Vout being high, PMOS transistor 203 receives a logic one signal on its gate, thereby turning off PMOS transistor 203. During a chip overheat condition, the voltage VBE of NPN transistors 204 and 205 near bandgap block 230 will be reduced due to the temperature increase. Reducing the voltage VBE can turn on NPN transistors 204 and 205. NPN transistor 205, when conducting, provides a low voltage to the gates of PMOS transistors 207 and 208. Consequently, PMOS transistors 207 and 208 are turned on, i.e. enabled. When PMOS transistor 208 is turned on, node A will be high because the transferred high voltage overcomes the weak pull down, thereby providing a logic one signal to NOR gate 209.

Thus, in a chip overheat condition, NOR gate 209 receives a logic one signal from node A (the output of shutdown circuit 200A) and a logic zero signal from node B (the output of shutdown circuit 200B). With these inputs, NOR gate 209 outputs a logic zero signal, which is then inverted by inverter 210. Therefore, the FAULT signal will be a logic one signal, which indicates a fault condition.

Regular Operation with No Fault Conditions: Vout=1

Note that if neither a local overheat (e.g. Ea short circuit) condition nor a chip overheat condition occurs, then NPN transistors 204, 205, 213, and 216 remain non-conducting. In this case, both nodes A and B are subject to the weak pull down because PMOS transistors 208 or 211 are not conducting. Thus, during normal operation without fault conditions, NOR gate 209 receives logic zero signals from nodes A and B, thereby outputting a logic one signal. Inverter 210 inverts that signal and outputs a logic zero signal, which indicates no fault conditions are present.

Voltage Regulator IC

Figure 3:
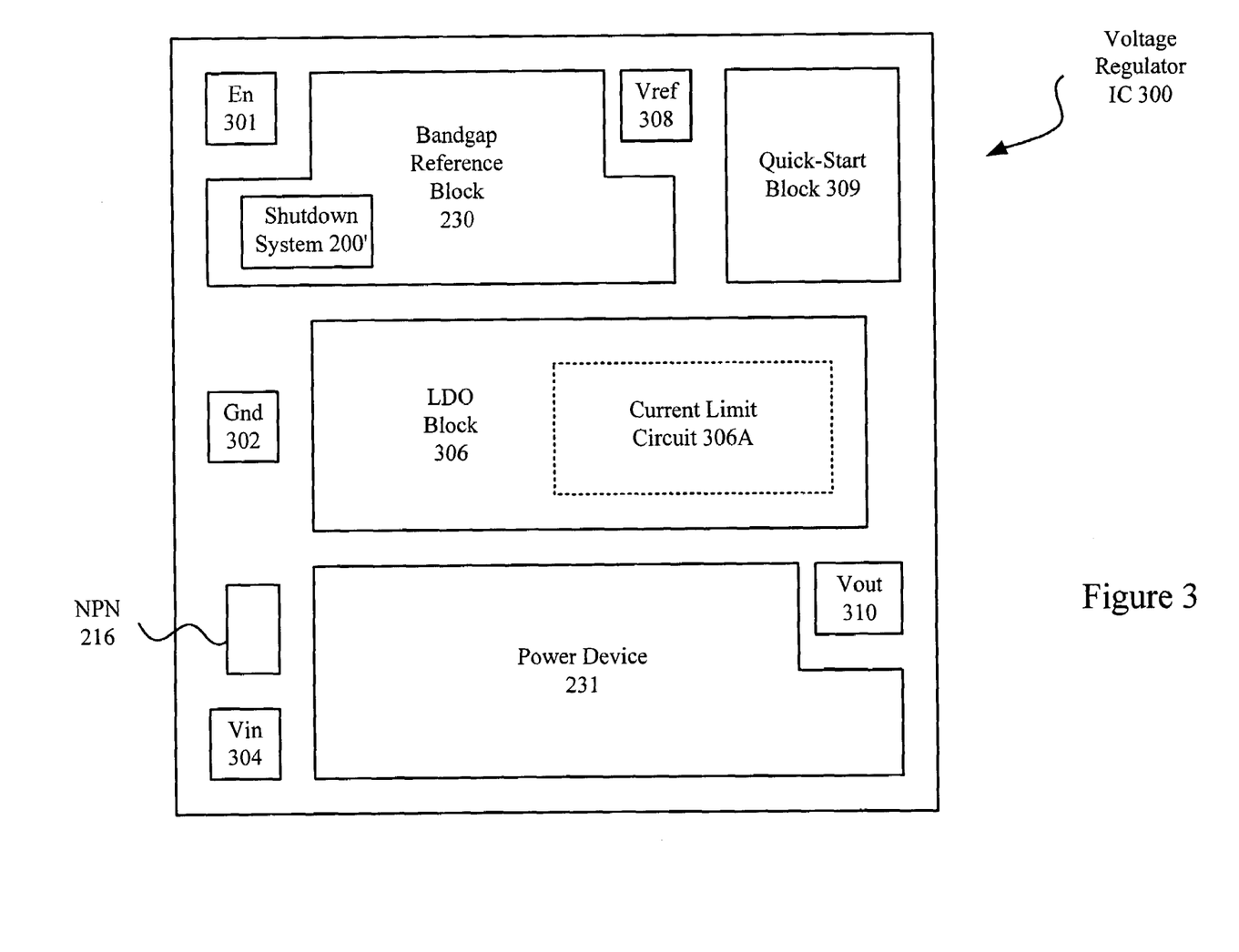
FIG. 3 illustrates an exemplary layout of a voltage regulator chip including the thermal shutdown system shown in FIG. 2.

FIG. 3 shows a layout of a voltage regulator integrated circuit (IC) 300 including the above-described shutdown circuits. In this embodiment, only one NPN transistor, i.e. NPN transistor 216, is placed near power device 231. The other parts of the shutdown system (labeled shutdown system 200') can be placed in a bandgap reference block 230. In one embodiment, a footprint for an integrated circuit including shutdown system 200 (FIG. 2) could be as small as 790μ×840μ. Notably, a footprint for shutdown system 200 could be as small as 80μ×60μ. Thus, shutdown system 200 can provide an extremely space efficient solution in addition to providing an accurate thermal shutdown for both local and chip overheat conditions.

In one embodiment of IC 300, a power device 231 can include tens of thousands of transistors. For example, power device 231 could have over 20,000 transistors. Note that transistor sizing may vary depending on the technology node. In one embodiment, the technology node could be at 0.5μ and all transistors (MOS and bipolar) can be formed to minimum size.

Bandgap reference block 230 can further include circuitry for providing a bandgap reference voltage VBG as well as voltage VB. Exemplary circuitry for bandgap reference block 230 is described in "A Simple Three Terminal IC Bandgap Reference" by A. P. Brokaw, in IEEE Journal of Solid State Circuits, vol. SC-9, pp. 388-393, December 1974, and U.S. Pat. No. 6,737,908, issued to Micrel, Inc. on May 18, 2004. In this embodiment of IC 300, a quick-start block 309 can be used to provide a pseudo bandgap voltage until bandgap reference block 230 is fully ramped up to the bandgap voltage. After bandgap reference block 230 can provide the desired voltage, quick-start block 309 can be bypassed.

The bandgap voltage provided by bandgap reference block 230 (or the pseudo bandgap voltage provided by quick-start block 309) can be provided to LDO block 306. LDO block 306 can include an LDO (low drop-out) regulator. This regulator can use a transistor operating in its linear region to subtract excess voltage from an applied input voltage, thereby producing a regulated output voltage. The drop-out voltage is the minimum input to output voltage difference required for the regulator to maintain an output voltage within a predetermined range of its nominal value.

In one embodiment, a current limit circuit 306A can form part of LDO block 306. Current limit circuit 306A can be user-adjustable with an external set resistor or a pre-set internal resistor (neither shown for simplicity). The current through this resistor could be monitored with a high impedance comparator. In one embodiment, the resistor could have a value between 154 Ω±0.5% and 2.29 Ω±0.5%. Current limit in the range of 150 mA to 1.5 A may be available.

Exemplary pins for voltage regulator IC 300 can include an enable pin 301, a ground pin 302, an input voltage Vin pin 304, a reference voltage Vref pin 308, and an output voltage Vout pin 310. The Fault signals generated by shutdown system 200' can be provided to various system components and/or outputs, as necessary for disabling those components/outputs.

Note that the layout configuration of voltage regulator IC 300 is exemplary, but not limiting. For example, other layout embodiments could have additional components of shutdown circuit 200B (e.g. NPN transistor 213, PMOS transistors 211, 212, and 215 of FIG. 2) proximate to power device 231. Notably, at least the triggering NPN transistor, i.e. NPN transistor 216, can be located proximate to power device 231, thereby ensuring a rapid thermal shutdown during a short circuit condition.

Thus, in general, at least a portion of the shutdown circuit for detecting a local overheat condition can be located proximate the heat-generating device. In contrast, the shutdown circuit for detecting a chip overheat condition can be located in another location on the chip (i.e. Ea location not proximate to the heat-generating device). Each shutdown circuit can receive a temperature independent signal (e.g. Vout) and a temperature sensitive signal (e.g. voltage VB). The temperature independent signal enables or disables the shutdown circuit. An enabled shutdown circuit can respond to the temperature sensitive signal to generate a fault condition (i.e. Ea chip overheat condition or a local overheat condition).

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, depending on the load connected to the IC, i.e. the load connected to Vout pin 310, the temperature triggering a thermal shutdown may vary. Advantageously, because separate shutdown circuits are provided, the thermal shutdown can be specified at any load condition (e.g. Ea no-load condition, a full-load condition, or some other defined load condition).

Note that although the described embodiment of shutdown system 200 includes PMOS and NPN transistors, other embodiments could include NMOS and PNP transistors having their terminals similarly connected (however, with opposite voltage sources). Therefore, shutdown system 200 can be implemented with the appropriate MOS and bipolar transistors depending on the conditions being detected. Moreover, although the control circuit for shutdown circuits 200A and 200B can be implemented with NOR gate 209 and inverter 210, any other appropriate logic or control circuitry can be used to detect whether a fault condition is occurring based on the outputs of the shutdown circuits.

Notably, the term "proximate" is relative to a particular IC. That is, a shutdown circuit proximate to a heat source means that that shutdown circuit is close enough to be quickly affected by a temperature increase of that heat source. On the other hand, a shutdown circuit not proximate to a heat source means that that shutdown circuit is not close enough to be quickly affected by a temperature increase of that heat source. Using this definition, how a particular IC is formed to dissipate heat can affect what is "proximate" and what is "not proximate". Thus, the term proximate can refer to a relative distance, but more generally can refer to how quickly a circuit can respond to a temperature increase in relation to a heat source.

Figure 4:
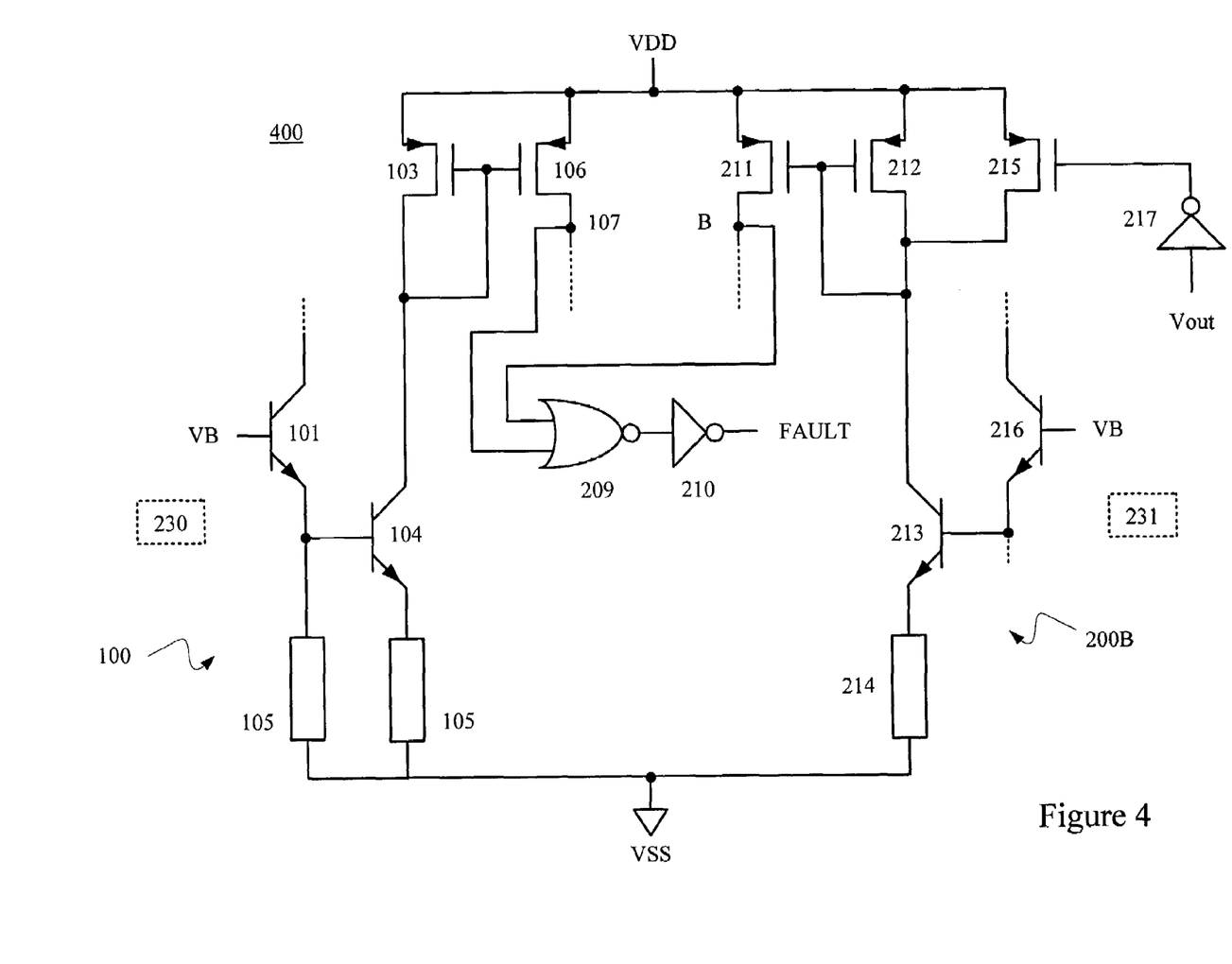
FIG. 4 illustrates another exemplary thermal shutdown system in which only one shutdown circuit receives a temperature independent enable signal.

In one embodiment shown in FIG. 4, a system 400 can include thermal shutdown circuit 100 and shutdown circuit 200B. In this case, only shutdown circuit 200B, which can quickly detect the local overheat condition, receives the temperature independent enable signal Vout. In other words, although it remains important for shutdown circuit 200B to be enabled to prevent an inappropriate shutdown, voltage VB by itself can still accurately activate thermal shutdown circuit 100. In this embodiment, node 107 (instead of node A) can be connected to the control circuit (e.g. NOR gate 209).

Figure 5:
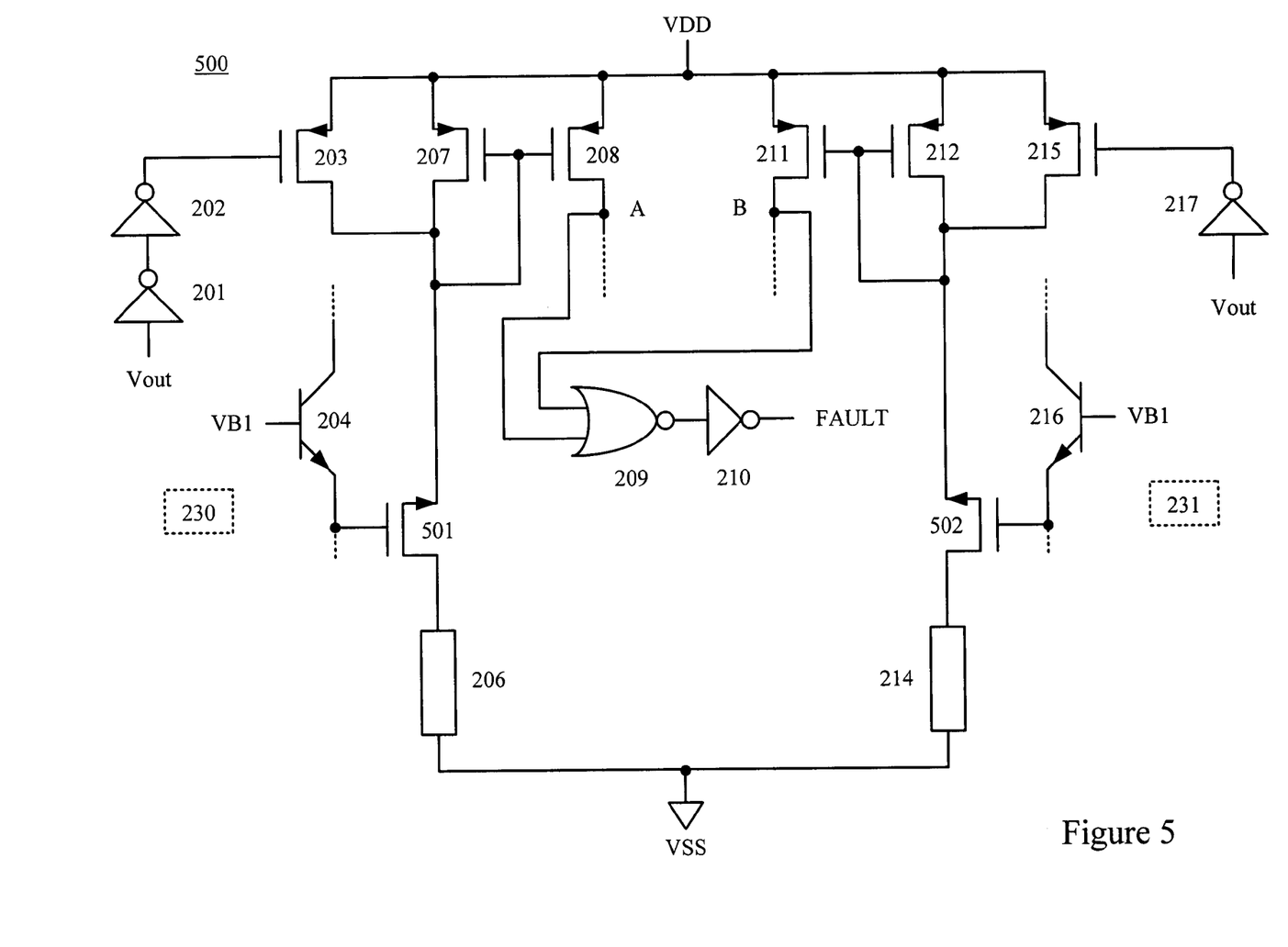
FIG. 5 illustrates yet another exemplary thermal shutdown system in which only the transistors receiving the temperature dependent signal are implemented in bipolar devices.

In yet another embodiment of a thermal shutdown system 500 shown in FIG. 5, NPN transistors 205 and 213 (FIG. 2) can be replaced with NMOS transistors 501 and 502, respectively. In this case, a voltage VB1 can be used as the temperature dependent voltage provided to the bases of transistors 204 and 206. Voltage VB1 can be somewhat higher than voltage VB (e.g. FIG. 2) to account for the higher threshold voltage needed to turn on NMOS transistors 501 and 502 during an overheat condition compared to an implementation using NPN transistors.

Accordingly, it is intended that the scope of the invention be defined by the following Claims and their equivalents.

The invention claimed is:

1. A thermal shutdown system for an integrated circuit (IC), the thermal shutdown system comprising:
   a first shutdown circuit triggered by a chip overheat condition, the first shutdown circuit including a first set of bipolar transistors sensitive to the chip overheat condition;
   a second shutdown circuit triggered by a local overheat condition, the second shutdown circuit including a second set of bipolar transistors sensitive to the local overheat condition; and
   a feedback signal provided to the first shutdown circuit and the second shutdown circuit, the feedback signal being temperature independent and able to anticipate the local overheat condition, wherein one of the first and second shutdown circuits inverts the feedback signal, and wherein the feedback signal enables one of the first and second shutdown circuits and disables the other.

2. The thermal shutdown system of claim 1, wherein at least a portion of the second shutdown circuit is positioned near a source generating the local overheat condition.

3. The thermal shutdown system of claim 2, wherein the source is a power device of a voltage regulator.

4. The thermal shutdown system of claim 3, wherein the local overheat condition is a short circuit.

5. The thermal shutdown system of claim 4, wherein the feedback signal is an output voltage of the integrated circuit.

6. The thermal shutdown system of claim 1, further including a control circuit for receiving outputs of the first and second shutdown circuits and determining whether a fault condition in the IC is occurring.

7. The thermal shutdown system of claim 6, wherein the fault condition includes one of the chip overheat condition and the local overheat condition.

8. A thermal shutdown system for an integrated circuit (IC), the thermal shutdown system comprising:
   a first shutdown circuit triggered by a chip overheat condition, the first shutdown circuit for receiving a temperature independent signal;
   a second shutdown circuit triggered by a local overheat condition, the second shutdown circuit for receiving the temperature independent signal, the temperature independent signal able to anticipate the local overheat condition, wherein one of the first and second shutdown circuits is enabled by the temperature independent signal and the other shutdown circuit is disabled by the temperature independent signal; and
   a control circuit for receiving output signals of the first and second shutdown circuits, the control circuit outputting a fault signal.

9. The thermal shutdown system of claim 8, wherein the local overheat condition is a short circuit and the temperature independent signal is an output voltage of the integrated circuit.

10. The thermal shutdown system of claim 8, wherein the control circuit includes a logic gate.

11. A thermal shutdown system for an integrated circuit, the thermal shutdown system comprising:
   a first PMOS transistor having a source connected to a first voltage source, a gate for receiving a triggering signal, and a drain;
   a second PMOS transistor having a source connected to the first voltage source, and a gate and a drain connected to the drain of the first PMOS transistor;
   a third PMOS transistor having a source connected to the first voltage source, a gate connected to the gate of the second PMOS transistor, and a drain connected to a first pull-down voltage;
   a fourth PMOS transistor having a source connected to the first voltage source, a gate for receiving an inverted triggering signal, and a drain;
   a fifth PMOS transistor having a source connected to the first voltage source, and a gate and a drain connected to the drain of the fourth PMOS transistor;
   a sixth PMOS transistor having a source connected to the first voltage source, a gate connected to the gate of the fifth PMOS transistor, and a drain connected to the first pull-down voltage;
   a first NPN transistor having a base connected to a bias voltage, a collector connected to a pull-up voltage, and an emitter connected to a second pull-down voltage;
   a second NPN transistor having a base connected the emitter of the first NPN transistor, a collector connected to the drain of the second PMOS transistor, and an emitter coupled to a second voltage source;
   a third NPN transistor having a base connected to the bias voltage, a collector connected to the pull-up voltage, and an emitter connected to the second pull-down voltage;
   a fourth NPN transistor having a base connected the emitter of the third NPN transistor, a collector connected to the drain of the fifth PMOS transistor, and an emitter coupled to a second voltage source; and
   a control circuit having a first input connected to the drain of the third PMOS transistor and a second input connected to the drain of the sixth PMOS transistor, the control circuit outputting a fault signal.

12. A thermal shutdown system for an integrated circuit, the thermal shutdown system comprising:
   a first MOS transistor having a source connected to a first voltage source, a gate for receiving a triggering signal, and a drain;
   a second MOS transistor having a source connected to the first voltage source, and a gate and a drain connected to the drain of the first transistor;
   a third MOS transistor having a source connected to the first voltage source, a gate connected to the gate of the second MOS transistor, and a drain connected to a first voltage associated with a second voltage source;
   a fourth MOS transistor having a source connected to the first voltage source, a gate for receiving an inverted triggering signal, and a drain;
   a fifth MOS transistor having a source connected to the first voltage source, and a gate and a drain connected to the drain of the fourth MOS transistor;
   a sixth MOS transistor having a source connected to the first voltage source, a gate connected to the gate of the fifth MOS transistor, and a drain connected to the first voltage;
   a first bipolar transistor having a base connected to a bias voltage, a collector connected to a second voltage associated with the first voltage source, and an emitter connected to a third voltage associated with the second voltage source;
   a second bipolar transistor having a base connected the emitter of the first bipolar transistor, a collector connected to the drain of the second MOS transistor, and an emitter coupled to a second voltage source;
   a third bipolar transistor having a base connected to the bias voltage, a collector connected to the second voltage, and an emitter connected to the third voltage;

a fourth bipolar transistor having a base connected the emitter of the third bipolar transistor, a collector connected to the drain of the fifth MOS transistor, and an emitter coupled to a second voltage source; and a control circuit having a first input connected to the drain of the third MOS transistor and a second input connected to the drain of the sixth MOS transistor, the control circuit outputting a fault signal.

13. A method of detecting a fault condition on an integrated circuit, the fault condition occurring because of a chip overheat condition or a local overheat condition, the method comprising:

locating at least a portion of a first shutdown circuit proximate to a source of the local overheat condition;

locating a second shutdown circuit not proximate to the source of the local overheat condition;

providing a temperature dependent signal to the first and second shutdown circuits;

providing a temperature independent signal to the first and second shutdown circuits, the temperature independent signal able to anticipate the local overheat condition, the temperature independent signal enabling one of the first and second shutdown circuits and disabling the other first and second shutdown circuit; and generating first and second outputs of the first and second shutdown circuits, respectively, based on the temperature dependent signal and the temperature independent signal, the first and second outputs being used to identify the fault condition.

14. A layout for an integrated circuit, the layout comprising:

a component including a heat generating source;

at least a portion of a first thermal shutdown circuit positioned proximate to the component;

a second thermal shutdown circuit not positioned proximate to the first component; and a feedback loop connected to the first thermal shutdown circuit and the second thermal shutdown circuit, the feedback loop providing a signal that enables one of the first and second thermal shutdown circuits and disables the other first and second thermal shutdown circuit, the signal able to anticipate a local overheat condition.

15. The layout of claim 14, wherein the component is a regulator, and wherein the heat generating source is a power device of the regulator.

16. The layout of claim 14, wherein a bipolar transistor of the first thermal shutdown circuit is positioned proximate to the component.

17. The layout of claim 14, wherein the feedback loop is further connected to an output voltage pin of the integrated circuit.

18. A thermal shutdown system for an integrated circuit (IC), the thermal shutdown system comprising:

a first thermal shutdown circuit; and a second thermal shutdown circuit, wherein each of the first and second thermal shutdown circuits receives:

a temperature independent signal that enables one of the first and second thermal shutdown circuits and disables the other thermal shutdown circuit, the temperature independent signal able to anticipate a local overheat condition; and a temperature dependent signal that can activate an enabled thermal shutdown circuit to indicate a fault condition, the fault condition being one of a chip overheat condition and the local overheat condition.

19. A thermal shutdown system for an integrated circuit (IC), the thermal shutdown system comprising:

a first thermal shutdown circuit for indicating a chip overheat condition; and a second thermal shutdown circuit for indicating a local overheat condition, wherein each of the first and second thermal shutdown circuits receives a temperature dependent signal that can activate the thermal shutdown circuit to indicate a fault condition, the fault condition being one of the chip overheat condition and the local overheat condition, and wherein at least the second thermal shutdown circuit receives a temperature independent signal that can anticipate the local overheat condition and disable the second thermal "shutdown circuit during normal operation and a chip overheat condition."

* * * * *

UNITED STATES PATENT AND TRADEMARK OFFICE
CERTIFICATE OF CORRECTION

PATENT NO. : 7,321,484 B2 Page 1 of 1
APPLICATION NO. : 11/165712
DATED : January 22, 2008
INVENTOR(S) : S. M. Sohel Imtiaz It is certified that error appears in the above-identified patent and that said Letters Patent is hereby corrected as shown below:

On the Title Page,

Item (57) ABSTRACT, line 13, amend "Ea" to -- a --.

Column 10, Claim 11, line 18, insert -- to -- before "the".

Column 10, Claim 11, line 26, insert -- to -- before "the".

Column 10, Claim 12, line 61, insert -- to -- before "the".

Column 11, Claim 12, line 1, insert -- to -- before "the".

Column 12, Claim 19, line 42, delete quotation marks before "shutdown".

Column 12, Claim 19, line 43, delete quotation marks after "condition.".

Signed and Sealed this

Third Day of June, 2008

JON W. DUDAS
*Director of the United States Patent and Trademark Office*